(12) United States Patent
Verma et al.

(10) Patent No.: US 12,033,812 B2
(45) Date of Patent: Jul. 9, 2024

(54) ELECTRONIC DEVICE AND METHOD FOR PRODUCING LAYERS OF THE SAME

(71) Applicants: EMPA EIDGENOSSISCHE MATERIALPRUFUNGS—UND FORSCHUNGSANSTALT, Dubendorf (CH); SOLARONIX S.A., Aubonne (CH)

(72) Inventors: Anand Verma, Bihar (IN); David Martineau, Etoy (CH); Frank Nuesch, Wangen (CH); Jacob Heier, Zurich (CH); Tobias Meyer, Fechy (CH)

(73) Assignees: EMPA EIDGENOSSISCHE MATERIALPRUFUNGS- UND FORSCHUNGSANSTALT, Dubendorf (CH); SOLARONIX S.A., Aubonne (CH)

( * ) Notice: Subject to any disclaimer, the term of this patent is extended or adjusted under 35 U.S.C. 154(b) by 694 days.

(21) Appl. No.: 17/055,334

(22) PCT Filed: May 17, 2019

(86) PCT No.: PCT/EP2019/062886
§ 371 (c)(1),
(2) Date: Nov. 13, 2020

(87) PCT Pub. No.: WO2019/219951
PCT Pub. Date: Nov. 21, 2019

(65) Prior Publication Data
US 2021/0225597 A1    Jul. 22, 2021

(30) Foreign Application Priority Data

May 17, 2018 (EP) ..................................... 18173048
Jun. 27, 2018 (EP) ..................................... 18180243

(51) Int. Cl.
*H01G 9/20* (2006.01)
*H10K 30/30* (2023.01)
(Continued)

(52) U.S. Cl.
CPC ........... *H01G 9/2009* (2013.01); *H10K 30/30* (2023.02); *H10K 71/40* (2023.02); *H10K 2102/00* (2023.02)

(58) Field of Classification Search
CPC ....... H01G 9/2009; H10K 30/30; H10K 71/40
See application file for complete search history.

(56) References Cited

U.S. PATENT DOCUMENTS

2017/0213651 A1    7/2017 Wang et al.
2021/0225597 A1*   7/2021 Verma .................... H10K 71/40

FOREIGN PATENT DOCUMENTS

CN    104124291 A    10/2014
WO    2015/031944 A1    3/2015

OTHER PUBLICATIONS

Burkitt, et al., "Perovskite solar cells in N-I-P structure with four slot-die-coated layers" R. Soc. Open Sci. (May 16, 2018) 5(5):172158.
(Continued)

*Primary Examiner* — Mark V Prenty
(74) *Attorney, Agent, or Firm* — Robert C. Netter, Jr.; Dann, Dorfman, Herrell & Skillman (57) ABSTRACT

The present invention concerns a method for producing layers of an electronic device and to a method for producing electronic devices. The method comprises co-firing a plurality of different overlapping or superposed films comprising metal oxides, precursors of the aforementioned and/or carbon, in addition to organic components. The method renders the manufacturing process of such electronic devices more efficient.

22 Claims, 2 Drawing Sheets

(51) Int. Cl.
*H10K 71/40* (2023.01)
*H10K 102/00* (2023.01)

(56) References Cited

OTHER PUBLICATIONS

Ke, et al., "Perovskite solar cell with an efficient TiO$_2$ compact film" ACS Appl. Mater. Interfaces (2014) 6(18):15959-6.

* cited by examiner

ELECTRONIC DEVICE AND METHOD FOR PRODUCING LAYERS OF THE SAME

The present application is § 371 application of PCT/EP2019/062886, filed May 17, 2019, which claims priority to EP Application No. 18173048.2, filed May 17, 2018, and EP Application No. 18180243.0, filed Jun. 27, 2018. The entire disclosure of each of the foregoing applications is incorporated by reference herein.

TECHNICAL FIELD

The present invention relates to electronic devices, methods for producing the devices and for producing a plurality of layers of such devices. In particular, the invention relates to novel methods for producing solar cells comprising a plurality of different layers. Preferably, the electronic device is an optoelectronic device.

Background Art and Problems Solved by the Invention

Among the group of sensitized and heterojunction photovoltaic solar cells, perovskite solar cells have exhibited greatest attention in the past few years and have reached certified power conversion efficiencies of above 22%. These types of solar cells are interesting basically due to the comparatively low costs of the starting materials compared to silicon based solar cells.

Consequently, there have been efforts to develop industrial scale processes for the fabrication of such solar cells. The development of cost efficient and scalable processes for producing such cells is key to their wider dispersal and their use in more applications.

An obstacle to the industrial scale production of sensitized and heterojunction solar cells lies in the fact that the processes used in the lab for producing such cells are not easily or not at all scalable. Furthermore, the currently used processes are not ideal in terms of cost efficiency. The semiconductor layers used, for example, in a perovskite or dye-sensitized solar cells are subjected to sintering after the deposition of each layer. In addition, certain deposition techniques frequently used for depositing one or several layers of the solar cell, such as spin coating, cannot be used on an industrial scale.

There have been efforts to produce sensitized and heterojunction solar cells by printing techniques. For example, Syed Ghufran Hashmi et al, Advanced Materials Technologies, 2 (1) 2017 discloses the efficient deposition of a perovskite layer by inkjet printing. CN203871350 mentions the possibility of inkjet printing several layers of a perovskite solar cell.

It is an objective of the invention to provide an efficient method for producing electronic devices, in particular optoelectronic devices such as sensitized, perovskite and heterojunction solar cells.

It is an objective of the invention to provide an efficient method for producing layers of electronic devices, in particular layers of sensitized, perovskite and heterojunction solar cells.

It is an objective of the invention to provide an efficient method for producing sintered layers of electronic devices, preferably a plurality of layers that require a single sintering step for being functional.

It is an objective of the invention to render the manufacturing of electronic devices more efficient in particular in terms of manufacturing time, costs, and energy expenditure.

It is an objective of the invention to provide manufacturing and/or deposition methods that can be scaled up, preferably to industrial manufacturing. It is also an objective of the invention to provide methods that allow the production of larger area electronic devices and parts thereof, compared to lab-scale devices.

The present invention addresses the problems depicted above.

SUMMARY OF THE INVENTION

Remarkably, the present inventors produced an electronic device by co-firing different layers of the device, including different metal oxide layers, and including compact and porous semiconductor layers.

This is surprising, as it was so far considered necessary to conduct a separate firing step after the deposition of a film comprising, for example, the metal oxide constituent of precursor of the layer to be produced. The method of the invention applies to manufacturing layers of layered electronic devices, to methods of depositing and producing layers of electronic devices, and to manufacturing electronic devices or parts thereof. Preferably said electronic devices are optoelectronic devices, such as solar cells.

In an aspect, the present invention provides a method for producing layers of an electronic device comprising a plurality of layers, the method comprising co-firing a plurality of layers, preferably comprising one single firing step.

In an aspect, the present invention provides a method for producing layers of an electronic device comprising said layers, the method comprising: depositing a plurality of different films, wherein said different films are destined to form different layers of said electronic device, wherein said method comprises co-firing said plurality of films by exposure to a temperature above 300° C., wherein, between depositing said films, no firing above 300° C. is performed.

In an aspect, the present invention provides a method for producing layers of an electronic device comprising said layers, the method comprising: depositing a plurality of different overlapping and/or superposed films, wherein said different films are destined to form different layers of said electronic device, wherein said method comprises co-firing said plurality of films by exposure to a temperature above 300° C., wherein, between depositing said films, no firing above 300° C. is performed.

In an aspect, the present invention provides a method for producing layers of an electronic device comprising said layers, the method comprising:

depositing a first composition to provide a first film, wherein said first composition comprises the inorganic or carbon constituents of a first layer of said electronic device, or precursors of said inorganic constituents, depositing a second composition to provide a second film, wherein said second composition comprises the inorganic or carbon constituents of a second layer of said electronic device, or precursors of said inorganic constituents, wherein said first and second compositions comprise, independently, at least one organic material, wherein said second film is at least partially deposited onto the first film so as to at least partially superpose and/or overlap with said first film, and, co-firing said two films by exposure to a temperature above 300° C., wherein, after depositing said first film, no firing above 300° C. is performed.

In an embodiment, the method comprises: providing a substrate, preferably for the deposition of at least said first film.

In an aspect, the present invention provides a method for depositing layers of an electronic device comprising said layers and/or for producing an electronic device, the method comprising firing two, three or more layers jointly, without a separate firing step between the deposition of said two, three or more layers and/or after the deposition of the first and/or second of said two, three or more layers, respectively.

In an aspect, the present invention provides a method for producing a plurality of layers of an electronic device comprising the step of co-firing successive layers without separate firing following the deposition of an individual layer or film.

In an aspect, the present invention provides a method for producing layers of an electronic device and/or for producing said device, wherein said method comprises: depositing a plurality of films, wherein different films are destined to form different layers of said electronic device, and, co-scribing said plurality of films, preferably by laser-scribing.

In an aspect, the present invention provides a method for producing layers of an electronic device comprising: scribing a substrate comprising one or several films that have been deposited on the substrate, wherein said laser scribing is conducted before the firing of said one or several films.

In an aspect, the present invention provides a method for scribing separating and/or insulating lines for providing separating and/or insulating lines between electronic devices or parts thereof, the method comprising: scribing a plurality of at least partially superposed and/or overlapping films, wherein said scribing is conducted before the firing of the plurality of films.

Surprisingly, thanks to the possibility of co-firing several layers jointly, it is possible to provide insulating lines and/or to electrically separate sections of deposited films by laser scribing of two or more deposited films but preferably not yet fired layers.

The methods of producing layers in accordance with the invention are preferably used in methods for producing electronic devices.

In an aspect, the invention provides a plurality of layers produced by the invention, a part of an electronic device, and electronic devices produced by the methods of the invention.

Preferred electronic devices are optoelectronic devices, such as solar cells. However, the present invention may be applied to other types of electronic devices, which are not optoelectronic or not necessarily optoelectronic.

Further aspects and preferred embodiments of the invention are discussed in the appended claims and the detailed description herein below.

DETAILED DESCRIPTION OF THE PREFERRED EMBODIMENTS

In some embodiments and aspects, the invention provides methods for producing layers of an electronic device, preferably an optoelectronic device. Preferably, said layers are a plurality of two, three, four or more layers, which are at least partially or totally superposed, superimposed and/or which overlap. Said plurality of layers may already provide a functional electronic device. Alternatively, one or more additional layers may be deposited for producing the functional electronic device. Said one or more additional layers are preferably deposited after co-firing said plurality of layers in accordance with the invention.

The electronic device may be any electronic device comprising two or more layers where at least one, preferably at least two layers require firing. In an embodiment, the electronic device is an optoelectronic device selected from solar cells, photodetectors, light emitting diodes (LEDs), such as perovskite light emitting diodes (PLEDs), transistors and detector. In a preferred embodiment, the optoelectronic device may be selected from solar cells, for example heterojunction solar cells, solid state solar cell, sensitized solar cells, in particular perovskite solar cells or dye-sensitized solar cells.

For the purpose of the present invention, the term "comprising" and its various grammatical forms is intended to mean "includes, amongst other". It is not intended to mean "consists only of".

Layers of solar cells and other electronic devices are generally provided by deposition on a substrate. Generally, the substrate is part of the electronic device to be produced. In other embodiments, the substrate is provided for the purpose of depositing films and/or layers in accordance with the invention, but the substrate may not be used in the final electronic device. The latter embodiment may imply that the plurality of layers may be removed from the substrate after it has been produced.

In some embodiments, the method of the invention comprises providing a substrate for depositing films that will form layers of an electronic device.

In an embodiment, the substrate is conductive. For example, the substrate itself comprises already a layer that imparts conductivity to the substrate. Preferably, the conductive layer is a transparent conductive oxide (TCO), such as indium doped tin oxide (ITO), fluorine doped tin oxide (FTO), $ZnO\text{—}Ga_2O_3$, $ZnO\text{—}Al_2O_3$, tin oxide, antimony doped tin oxide (ATO), $SrGeO_3$ and zinc oxide. These materials may be coated on a substrate, such as transparent plastic or glass.

The conductive substrate may operate as the front or as the back contact of the electronic device, depending on the device architecture. In some embodiments, the substrate is transparent. The substrate may be selected from conductive glass or conductive plastic. The substrate may be flexible.

In other embodiments, the substrate is not transparent. Transparency of the substrate is preferred in the case of devices where the side of the substrate is exposed to the electromagnetic radiation that is to be transformed to electricity in the case of a solar cell, but also in the case of optoelectronic devices, which are intended to emit light through the substrate, in case of LEDs, for example.

In an embodiment, the method of the invention comprises depositing two or more compositions in the form of two or more films, respectively. In an embodiment, the method comprises depositing three films, four films, five films, six, n films, and so forth. Small "n" represents any integer, preferably between 2-50, more preferably 2-20, most preferably 3-10 films. At least the first film is preferably deposited on said substrate or on another film or another layer that has been previously deposited on the substrate, wherein said other film or other layer was deposited according to a method other than according to the invention.

In the present specification, the term "film" is generally used to refer specifically to the layer as deposited but not yet fired, whereas the term "layer" is generally used to refer to the layer as obtained after firing. In this context, the term "layer" is thus generally the layer as appearing in the finished and/or functional device, whereas the "film" comprises at least some constituents of the respective composition that are generally no longer present, or not present in this form, in the finished device, as these constituents are generally removed by drying, firing or other treatments, as the case may be. The term "layer" may also be used more generally for referring to both, the "film" immediately after deposition and the fired layer, if the distinction between the two is not necessary.

It is noted that the sequential deposition of films, one atop the other, having an identical composition is generally considered as the deposition of a single film. On the other hand, films having identical compositions that are spaced apart by a film having a different composition are considered as separate and/or different films.

For the purpose of the present specification the term "different" in the context of a "different film" and/or a "different composition" refers preferably to a difference with regard to the inorganic constituents, precursors of such inorganic constituents and/or carbon. Therefore, preferably, "different" refers to a difference in the layer to be obtained after firing compared to another layer, for example compared to the preceding or subsequent layer. For example, different compositions may comprise different metal oxides, such as $TiO_2$ and $ZrO_2$. For example, a composition comprising essentially carbon particles is considered different from a composition comprising essentially metal oxide nanoparticles as inorganic constituents. The term different may also apply to compositions comprising the same inorganic material, but in a different form or different particle sizes or different particle size distributions, resulting in an overall different layer of the final device. For example, compact and mesoporous $TiO_2$ layers are different layers and are generally obtained by depositing different compositions.

In an embodiment, the invention comprises depositing and co-firing two or more films comprising different metal oxides. In an embodiment, said different metal oxides are selected from oxides or different metals or different oxides of a same metal.

In an embodiment, wherein said first composition comprises a first metal oxide and wherein one or more selected from said second, third and/or fourth composition, if applicable, comprises a second metal oxide, wherein said first metal oxide is a different metal oxide than said second metal oxide, preferably an oxide from a different metal.

In an embodiment, wherein said second composition comprises a metal oxide and one selected of said third and/or fourth composition, if applicable, comprises another metal oxide, wherein said metal oxides are preferably oxides of different metals.

In a preferred embodiment, said different metal oxides in the embodiments above are present as nanoparticles in said compositions.

In an embodiment, the method comprises depositing and co-firing one or more films comprising a metal oxide or a precursor thereof, and a film comprising carbon particles, such as carbon black and/or graphite particles, for example.

In an embodiment, the method comprises depositing and co-firing a film comprising metal oxide nanoparticles and a film comprising carbon particles, such as carbon black and/or graphite particles, for example.

In an embodiment, the invention comprises co-firing two or more different films each of said two or more different films comprising nanoparticles, and/or which comprises co-firing two or more different films yielding two or more mesoporous layers. To make an example, the invention discloses co-firing a film comprising $TiO_2$ nanoparticles and a film comprising $ZrO_2$ nanoparticles, yielding two different mesoporous layers upon co-firing.

In an embodiment, wherein said first composition comprises a first metal oxide and said second or third composition, if applicable comprises a second metal oxide, wherein said first metal oxide is a different metal oxide than said second metal oxide, preferably an oxide from a different metal.

In an embodiment, successive films, such as, for example said first and said second film, or said second and said third film, are in direct physical contact with each other, preferably in the area where they overlap. In the overlapping or superposed area, successive films are preferably deposited one atop the other (preceding) film.

For the purpose of the present specification, a "preceding" film is a film that has been deposited before a successive film, such that a successive film is preferably superposing and/or at least partially overlapping (covering) the preceding film.

Deposition techniques for depositing layers of electronic devices are known. Such deposition methods include spin coating, screen printing, sputtering, evaporation, including chemical and physical vapor deposition (PVD, CVD), atomic layer deposition (ALD), spray-coating, electrospraying, blade coating, inkjet printing and other methods.

In a preferred embodiment of the invention, slot-die printing is used for depositing one or more films. Slot-die printing of films is illustrated in the illustrative examples provided further below and preferred compositions for slot-die printing are disclosed elsewhere in this specification.

For the deposition of compositions accordance with the present invention, solvent based deposition methods, such as printing techniques, including screen printing, inkjet printing, spray-coating, electrospraying and slot-die printing, are preferred. Preferably, said compositions comprise one or more solvents, besides constituents for forming the corresponding layer. In some embodiments, said compositions may comprise further organic constituents, such as binders.

The present invention does not exclude other deposition processes and encompasses the deposition of layers by chemical and physical vapor deposition (PVD, CVD), atomic layer deposition (ALD), pulsed laser deposition (PLD) for example. Such layers generally lack additional, in particular organic, constituents present in the compositions set out in this specification. Therefore, these latter layers, if present and included in the final device, are generally not counted in said two or more and up to n layers obtained in accordance with the present invention.

In an embodiment, said compositions for example said first, second, and if applicable, third, fourth, and up to $n^{th}$ compositions comprise, independently one from the other, one or more selected from the group consisting of: an inorganic material, carbon, and a metal-organic precursor of said inorganic material. The inorganic material and/or carbon comprises preferably the constituent of the fired layer, for example substantially as appearing in the final device.

In said compositions said inorganic material and/or carbon is preferably present in the form of particles, for example nanoparticles in the case of metal oxide materials, and micro and/or nanoparticles in the case of carbon.

In an embodiment, the composition comprises precursor of an inorganic material, preferably a metal-organic precursor of an inorganic material. Preferably, the metal-organic compound comprises one or more metal cations and one or more organic oxides, such as an alkoxide. Said precursor is preferably useful for a sol-gel production of the inorganic constituent of the electronic device. The metal of said metal alkoxide is preferably selected from the metals as present in the inorganic semiconductor and/or insulating materials disclosed elsewhere in this specification, such as Ti, Al, Zr, Hf, Sn, Fe, Zn, W, Nb, In, Pr, Ce, Y, Zn, including alkaline metals, alkaline earth metals and any other lanthanide, for example. In an embodiment, said metal-organic precursor comprises two or more different metals.

The metal-organic compound may be a precursor of a semiconductor or of an insulating material, preferably a metal oxide semiconductor material. An exemplary precursor of an inorganic material is titanium diisopropoxide bis(acetylacetonate). This compound may be present in formulations intended to form a compact $TiO_2$ layer. The inorganic layer is formed, for example, by drying and/or firing of the layer comprising the organic titanate.

In an embodiment, one or more of said films, preferably two or more of said films, for example said first, second, third, fourth and/or $n^{th}$ film or compositions, in as far as present, comprise at least one inorganic semiconductor material, or a precursor thereof.

Semiconductor materials may be selected from n- and p-type semiconductors. In a preferred embodiment, the semiconductor material is an n-type semiconductor material. In a most preferred embodiment, one or several compositions comprise metal oxide semiconductor or insulator materials, or precursors thereof, for example nanoparticles of such materials.

In an embodiment, one or more of said first, second, third, fourth and $n^{th}$ film and/or composition, in as far as present, comprises at least one metal oxide, preferably a semiconductor metal oxide.

In an embodiment, one or more of said first, second, third, fourth, and $n^{th}$ film and/or composition, in as far as present, comprises nanoparticles, preferably nanoparticles of a semiconductor material, insulator material or carbon. For forming a porous carbon layer, the composition preferably comprises carbon nano- and/or microparticles.

According to an embodiment, the composition comprises of one or more semiconductor materials selected from the group consisting of Si, $SiO_2$, $TiO_2$, $Al_2O_3$, $ZrO_2$, $HfO_2$, $SnO_2$, $Fe_2O_3$, ZnO, $WO_3$, $Nb_2O_5$, $In_2O_3$, $Bi_2O_3$, $Y_2O_3$, $Pr_2O_3$, $CeO_2$ and other rare earth metal oxides, CdS, ZnS, PbS, $Bi_2S_3$, CdSe, CdTe, $MgTiO_3$, $SrTiO_3$, $BaTiO_3$, $Al_2TiO_5$, $Bi_4Ti_3O_{12}$ and other titanates, $CaSnO_3$, $SrSnO_3$, $BaSnO_3$, $Bi_2Sn_3O_9$, $Zn_2SnO_4$, $ZnSnO_3$ and other stannates, $CaZrO_3$, $SrZrO_3$, $BaZrO_3$, $Bi_4Zr_3O_{12}$ and other zirconates, combinations of two or more of the aforementioned and other multi-element oxides containing at least two of alkaline metal, alkaline earth metal elements, Al, Ga, In, Si, Ge, Sn, Pb, Sb, Bi, Sc, Y, La or any other lanthanide, Ti, Zr, Hf, Nb, Ta, Mo, W, Ni or Cu.

Si, $Fe_2O_3$, CdS, PbS, $Bi_2S_3$, $MoO_3$, $MnO_2$, CdSe, CdTe, are colored semiconductors and are less preferred in accordance with embodiments according to the present invention.

$WO_3$, $Bi_2O_3$, are yellowish. In accordance with the invention, colorless to slightly yellow materials with a band gap of greater than 2.7 eV are preferred. Colorless materials with a band gap of greater than 3 eV are more preferred, $TiO_2$ is most preferred.

Preferred p-type semiconductor materials are NiOx, where x is in the range of 0.5-2, preferably 1-2. In an embodiment, the composition comprises nanoparticles of NiOx or an metal-organic precursor of one or more of the aforementioned. P-type semiconductor materials may be used in the preparation of electronic devices, such as perovskite solar cells having a p-i-n architecture.

The metal oxide materials indicated above may be deposited, independently, to provide a compact layer and/or to provide a mesoporous layer. The materials may be present in said compositions in the form of nanoparticles and/or in the form of metal-organic precursors, for example in the case of the production of a compact layer.

The electronic device preferably comprises one, two or more semiconductor layers of different structure and/or composition. For example, the device comprises a compact semiconductor layer, also known as the 'hole blocking layer' in the n-i-p device architecture respectively as the 'electron blocking layer' in the p-i-n structure, and a mesoporous semiconductor layer. Accordingly, the method of the invention preferably comprises depositing a composition comprising a material capable of forming the compact semiconductor layer and another composition preferably comprising nanoparticles of a semiconductor material for forming said mesoporous layer. Preferably said semiconductors are metal oxides, for example selected from the metal oxides disclosed in this specification.

In some embodiments, the device comprises one or more insulating layers. The device may comprise a compact insulating layer and/or a mesoporous insulating layer. In a preferred embodiment, a mesoporous insulating layer is present. The methods of the invention preferably comprise depositing one or more compositions comprising an insulating material.

In a preferred embodiment, the method preferably comprises depositing a layer comprising nanoparticles of an insulating material. Preferably, the insulating material is a metal oxide. Metal oxide insulating materials may be selected from $ZrO_2$, $Al_2O_3$, and $SiO_2$, for example. $ZrO_2$ is a preferred insulating material. Instead of an insulating material, a wide band gap semiconductor may be used, where wide band gap refers to a band gap of 2-4 eV. An insulator would have a band gap of above 4 eV.

In a preferred embodiment, the electronic device comprises a carbon layer. The carbon layer may operate as a hole transport material, as cathode and/or as a back contact of electronic devices, such as solar cells. In some embodiments, the carbon layer is porous. In an embodiment, the method comprises depositing a composition comprising carbon material, for example carbon particles.

Constituents of a carbon layer may comprise, for example, carbon black particles and/or graphite particles, preferably graphite flakes or microparticles and carbon black nanoparticles, or a mixture comprising both of them. The constituents of the porous carbon layer may also comprise metal particles, for example to increase electrical conductivity, and the composition for depositing the carbon layer comprises said metal particles. These constituents are preferably present in the compositions for depositing a carbon layer.

In a preferred embodiment, said compositions deposited in accordance with the invention comprise one or more organic components. Such organic materials preferably comprise organic solvents, binders and/or other additives, for example surfactants. Components of the composition other than the inorganic constituents, precursors thereof and carbon may be considered as the carrier components of the composition, as they operate as a carrier system for said inorganic constituents, precursors thereof, and/or carbon. Preferably, the carrier components comprise one or more solvents, one or more binders, and optionally one or more surfactants, for example.

The organic components of the compositions preferably comprise one or more solvents, for example two or more solvents. The solvents or solvent mixture of a particular composition is preferably selected in accordance with a particular deposition technique. Solvents encompass low and high boiling point solvents. Solvents may include organic solvents and water, for example. Organic solvents include protic and aprotic solvents, aromatic and non-aromatic solvents, alkyl alcohols such as methanol, ethanol, propanol, terpene solvents, such as monoterpene alcohols, organic solvents such as tetralin, just to mention a few of the solvents that were used in the examples herein below. The invention is of course not limited with respect to the solvent selected for providing the composition to be deposited.

A binder agent is any material or substance that holds or draws other materials together to form a cohesive whole mechanically, chemically, by adhesion or cohesion. The binder preferably has the purpose of suspending, binding and homogenizing (binding) materials present in the composition to be deposited. In some embodiments, the composition comprises one or more organic binders. Organic binders may be selected from bitumens, animal and plant glues, and polymers. In an embodiment, the binder comprises a polysaccharide and/or an artificial (synthetic) polymer. Exemplary binders used include wax, linseed oil, gums, such as gum arabic and gum tragacanth, methyl cellulose, or proteins, such as egg white or casein.

In a preferred embodiment, the binder is cellulose or a derivative of cellulose, wherein a derivative of cellulose encompasses any molecule comprising the cellulose backbone and an organic substituent being bound via a hydroxy group of the cellulose monomer (glucose). Exemplary cellulose derivatives of cellulose are alkyl cellulose (methyl cellulose, ethyl cellulose, methyl-ethyl cellulose), hydroxyalkyl cellulose, cellulose carboxylate, alkyl cellulose carboxylate, and hydroxyalkyl cellulose carboxylate, for example. Preferably, the binder comprises a polysaccharide and/or derivative thereof, and or polysaccharides and derivatives thereof. Preferably, the binder is soluble in said solvents or solvent mixture. Therefore, the binder may preferably be selected depending on said solvents and/or solvent mixture.

Preferably, the organic binder is selected and/or designed to disintegrate during the firing step.

It is noted here that compositions for depositing films for producing solar cells are commercially obtainable, for example from Solaronix SA, Switzerland. Such compositions are available, for example, in the forms of pastes that are customized to screen printing or customized to for other deposition techniques.

The present invention does preferably not exclude drying before the deposition of a subsequent film. Drying steps have the general purpose of removing partly or totally the one or more solvents present in the respective composition. Generally, drying does not remove the binders. Firing, on the other hand, has generally the purpose of destroying and/or removing the organic material that was present in the precursor layer. Preferably, organic material is removed entirely during firing.

In a preferred embodiment, the methods comprise drying said first, second, and, if applicable, third, fourth and/or $(n-1)^{th}$ film after deposition and before deposition of a subsequent film, wherein drying is preferably conducted at a temperature of <300° C., more preferably 5<250° C., most preferably <200° C.

In an embodiment, the method of the invention comprises depositing a first composition to provide a first film. Preferably, the composition is deposited in the form of a film on said substrate. The second composition may be selected from compositions as detailed elsewhere in this specification. Preferably, the first composition comprises the inorganic or carbon constituents of a first layer of said electronic device, or precursors of said inorganic constituents. The first composition preferably comprises organic components in addition to one or more selected from inorganic constituents, precursors thereof, or carbon. Said organic components preferably include one or more binders and/or solvents, for example. Drying, for example in the form of a separate step, may be conducted after deposition of the first film as described above.

In an embodiment, the method of the invention comprises depositing a second composition to provide a second film, wherein said second composition comprises the inorganic or carbon constituents of a second layer of said electronic device, or precursors of said inorganic constituents. The second composition may be selected from compositions as detailed elsewhere in this specification. Preferably, the second composition is different from the first composition. The second composition preferably comprises organic components in addition to one or more selected from inorganic constituents, precursors thereof, or carbon. Said organic components preferably include one or more binders and/or solvents. Drying may be conducted after deposition of the second film as described above.

The invention does not exclude and therefore encompasses the deposition of layers or films between films of the invention, or on the substrate before deposition of said first film, for example between said first and second films. Such layers may involve the deposition of compositions other than those disclosed in the present specification. For example, the invention encompasses and/or does not exclude deposition of a layer by ALD on top of a film deposited in accordance with the invention, before deposition of a subsequent film in accordance with the invention.

Preferably, said second film is at least partially deposited onto the first film so as to at least partially overlap with said first film. For example, the first and second films may be deposited so as to be substantially superposed. In an example, one film extends beyond a border of the other, for example the preceding or subsequent film.

In a preferred embodiment, two films "overlap" if 5% or more of the surface of a film is superposed by a subsequent or preceding film, meaning that 5% or more of the surface of one of the films extends on the same area on the substrate as the other film with which it overlaps. Preferably, two films "overlap" if 10% or more, 20%, 30%, 50% or more of the surface of a film is superposed by a subsequent or preceding film. For example, a film covering entirely a preceding film and extending beyond the preceding film overlaps with the preceding film, as the surface of the preceding film is entirely (100%) covered. Preferably, these surfaces are continuous surfaces of a layer.

In an embodiment, the method comprises co-firing said two or more (n) films by exposure to a temperature above 300° C., wherein, after depositing said first, second, third, and up to (n−1)$^{th}$ film, no firing above 300° C. is performed. Preferably, firing after deposition of the first layer and before the deposition of the second layer is absent. The term "co-firing" is used herein to specify that there is only a single firing step for firing the two and up to n layers, and/or to specify that no firing is conducted before the deposition of the second and up to (n−1)$^{th}$ film. "Co-firing" does not exclude exposing the two and up to n films, as applicable, to several firing steps after the deposition of the second and up to n$^{th}$ film.

For co-firing a plurality of layers, one may use the same equipment (e.g. ovens) and generally the overall same parameters as for sintering layers individually and successively.

For the purpose of the present specification, the terms "firing", "co-firing" and their grammatical forms are considered to be equivalent to "sintering" and/or "annealing", for example. For the purpose of the present specification, the aforementioned terms refer to a temperature treatment where the layers are exposed to a temperature above 300° C. or more.

In an embodiment, co-firing of said films yields the layers of said electronic device, wherein said layers preferably lack organic material that was present in said compositions.

In an—embodiment, (co-)firing, sintering and/or annealing is conducted at a temperature of ≥300° C., preferably ≥350° C., more preferably ≥400° C., and most preferably ≥450° C.

In an embodiment, co-firing is conducted at a temperature of <550° C., preferably <520° C., more preferably <500° C., and most preferably <480° C.

In a preferred embodiment, co-firing is conducted at a temperature of 300-550° C., preferably 300-520° C., more preferably 350-500° C., more preferably 350-480° C., and most preferably 400-480° C.

Co-firing temperatures below 500° C. are in particular preferred in embodiments where films comprising carbon particles for producing a porous carbon layer are also present and co-fired together with one or more films comprising metal oxides or precursors thereof. The present inventors observed that co-firing stacks comprising metal oxide and carbon layers, due to cracking of the carbon layer.

As indicated, the invention encompasses depositing two or more films, in particular up to n films, and co-firing two or more, in particular said up to n films. In a preferred embodiment, the invention encompasses depositing and co-firing all films requiring firing.

The co-fired films preferably do not encompass films/layers requiring organic components in the functional layer of the final device. For example, the device may not be cofired after deposition of an organic-inorganic perovskite layer, of an organic dye, and/or of an organic hole transport material or more generally of an organic semiconductor. Such layers, in as far as encompassed by the present invention, are preferably deposited after co-firing.

In an embodiment, the method of the invention comprises:
  depositing a third composition to provide a third film, which at least partially superposes and/or overlaps with said second film, said third composition comprising inorganic or carbon constituents of a third layer of said electronic device or precursors of said inorganic constituents;
  co-firing said first, second and third films by exposure to a temperature above 300° C., wherein, after depositing said first and second film, no firing above 300° C. is performed.

Preferably, said third composition is different from said second composition. More generally, an n$^{th}$ composition is different from an (n−1)$^{th}$ composition deposited to form an (n−1)$^{th}$ film.

In an embodiment, the method of the invention comprises:
  depositing a fourth composition to provide a fourth film, which at least partially superposes and/or overlaps with said third film, wherein said fourth composition comprises inorganic or carbon constituents of a third layer of said electronic device, or precursors of said inorganic constituents;
  co-firing said first, second, third films and fourth by exposure to a temperature above 300° C., wherein, after depositing said first, second and third film, no firing above 300° C. is performed. Preferably, said fourth composition is different from said second composition.

Preferably, said third and/or fourth composition, as applicable, comprises organic components, such as one or more binders and preferably one or more solvents. As mentioned elsewhere, the exact formulation of the composition, in particular the choice and amount of solvent(s) is generally dependent on the deposition technique selected for depositing the film and on the inorganic or carbon constituents of the composition (including the metal-organic precursor, if present).

Preferably, said second, third, fourth, and n$^{th}$ film, in as far as present, is deposited at least partially onto the respective preceding film so as to at least partially superpose and/or overlap with the respective preceding film.

In an embodiment, one, several or all of said films has a thickness of <3 mm, preferably <1 mm, after deposition and before optional drying and before firing. Preferably, each of said layers, after firing, has a thickness of ≤200 μm, preferably ≤100 μm, most preferably ≤20 μm.

In a preferred embodiment, one, several or all each of said films has a thickness of ≤2000 μm, preferably ≤700 μm, after deposition and before optional drying and before firing. Preferably, each of said layers, after firing, has a thickness of ≤50 μm, preferably ≤10 μm.

Preferably, during firing, the thickness of the films is reduced, which may be explained by the fact that the organic material contained in the composition is removed (disintegrated) and possibly by material changes experienced by inorganic or carbon materials during the firing process. Therefore, the layer in the finished device is generally thinner than the deposited film from which the layer is produced by firing.

In an embodiment, the method comprises depositing a film intended to provide a compact metal oxide semiconductor layer, for example a compact TiO$_2$ layer. Preferably, after deposition and before drying (optional) and before firing, the film has a thickness of 7-500 μm, preferably 10-400 μm. The layer obtained after firing said film preferably has a thickness of 5-250, more preferably 5-150 nm, most preferably 5-100 nm.

In an embodiment, the method comprises depositing a film intended to provide a mesoporous metal oxide semiconductor layer, preferably a mesoporous n-type semiconductor layer, for example a mesoporous TiO$_2$ layer. Preferably, after deposition and before drying (optional) and before firing, the film has a thickness of 100 nm-2000 μm, preferably 200 nm-1000 μm. The layer obtained after firing said film preferably has a thickness of 50 nm-5 µm, more preferably 150 nm-2 µm, most preferably 300-1000 nm.

In an embodiment, the method comprises depositing a film intended to provide a mesoporous metal oxide insulator layer, for example a mesoporous $ZrO_2$ layer. Preferably, after deposition and before drying (optional) and before firing, the film has a thickness of 100 nm-2000 µm, preferably 300 nm-1000 µm. The layer obtained after firing said film has preferably a thickness of 50 nm-10 µm, more preferably 150 nm-5 µm, most preferably 400 nm-2 µm.

In an embodiment, the method comprises depositing a film intended to provide a mesoporous metal oxide semiconductor layer, preferably a p-type semiconductor layer, for example an NiOx layer (x being between 0.5 and 2, preferably between 1 and 2). The layer obtained after firing said film has preferably a thickness of 50 nm-2 µm, more preferably 50 nm-1.5 µm, most preferably 100 nm-1 µm.

In an embodiment, the method comprises depositing a film intended to provide a carbon layer. Preferably, after deposition and before drying (optional) and before firing, has a thickness of 50 nm-2000 µm, preferably 100 nm-1000 µm. The layer obtained after firing said film preferably has a thickness of 10 nm-100 µm, more preferably 50 nm-50 µm, most preferably 100 nm-20 µm.

Drying may optionally be conducted after deposition of said first, second, third, fourth, fifth, sixth, or $n^{th}$ films, as appropriate, and preferably before firing.

Figure 1:
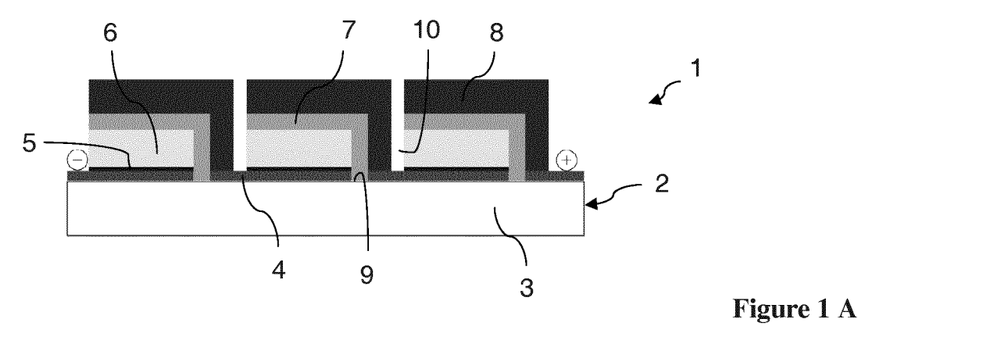
FIGS. 1A and 1B schematically show the architectures of solar cells (n-i-p device) produced in accordance with embodiments of the present invention.

In a preferred embodiment, the electronic device is a perovskite solar cell, preferably a "monolithic" solar cell (cf. FIG. 1). Such cells have the particularity that most or preferably all inorganic layers are produced before the cells is infiltrated with the sensitizer, such as perovskite. In an embodiment, the device comprises a compact metal oxide semiconductor layer, a mesoporous metal oxide semiconductor layer, a mesoporous insulator layer, a porous hole conductor or carbon layer, and a perovskite layer infiltrated in the pores of the mesoporous semiconductor and insulating layers. The perovskite deposition occurs by depositing one or more inks comprising dissolved constituents of the perovskite layer onto the porous carbon layer. The cofiring of the metal oxide and carbon layers in this context is particularly advantageous and takes place before deposition of the perovskite layer.

The embodiments herein below may apply to the "monolithic" solar cell but may also apply to other types and architectures of electronic devices.

In an embodiment, said $n^{th}$ composition, preferably said first composition comprises the constituents, or the precursors of such constituents, of a compact metal oxide semiconductor layer, preferably a compact $TiO_2$ and/or a compact NiOx layer, or a compact layer of a metal oxide semiconductor material as disclosed elsewhere in this specification.

In case of device having a n-i-p structure, said semiconductor of said compact metal oxide semiconductor layer is preferably an n-type semiconductor, such as a compact $TiO_2$ (c$TiO_2$) layer. In case of a p-i-n device, said semiconductor of said compact metal oxide semiconductor layer is preferably an p-type semiconductor layer, such as a compact NiOx layer.

In an embodiment, said $n^{th}$ composition, preferably said second composition, comprises the constituents, or the precursors of such constituents, of a mesoporous metal oxide semiconductor layer, preferably a mesoporous $TiO_2$ and/or a mesoporous NiOx layer (x being between 0.5 and 2, preferably between 1 and 2), or a mesoporous layer of a metal oxide semiconductor material as disclosed elsewhere in this specification.

In case of device having a n-i-p structure, said semiconductor of said mesoporous metal oxide semiconductor layer is preferably an n-type semiconductor layer, such as a m$TiO_2$ layer. In case of a p-i-n device, said semiconductor of said mesoporous metal oxide semiconductor layer is preferably an p-type semiconductor, such as a compact NiOx layer.

In an embodiment, said $n^{th}$ composition, preferably said third composition, comprises the constituents, or the precursors of such constituents, of a mesoporous metal oxide insulating layer, preferably a porous $ZrO_2$ layer.

In an embodiment, said $n^{th}$ composition, preferably said fourth composition, comprises the constituents, or the precursors of such constituents, of a porous carbon layer. Constituents of a composition for depositing a porous carbon layer have been disclosed elsewhere in this specification.

As described elsewhere in this specification, said compositions preferably comprise organic components including binders and preferably organic solvents. Following deposition, the layers are preferably co-sintered as disclosed elsewhere. By conducting a single firing step, instead of a firing step after deposition of each metal oxide and/or carbon film, the process for manufacturing the layers and/or the entire electronic device becomes substantially more cost and labour efficient. In addition to the advantage in terms of process costs and efficiency, the method of the invention provides other advantages, related, for example, to the scaled manufacturing of electronic devices, as set out below.

In an embodiment, the method comprises, after depositing said first and second film, and optionally after depositing said third, fourth and $n^{th}$ film, as applicable, and before co-firing said films, scribing said deposited films, in order to provide separating and/or insulating lines. Such lines may provide separate areas of said deposited films, thereby electrically separating said areas of a previously continuous film. Such insulating lines may provide individual cells. Preferably, said scribing is laser-scribing.

In the fabrication of layers electronic devices, in particular the optoelectronic devices, scribing and/or etching is conducted to remove material that has been previously been deposited. By scribing, a continuous layer may be divided in separate areas on a same substrate, for example layers that comprise electrically separated areas. In the overall manufacturing process, areas of layers separated by scribing may later be connected in series, for example by deposition of layers that provide an interconnection of devices at selected positions, in particular connecting a positive contact of a cell with the negative contact of another, e.g. subsequent cell. Scribing generally results in the creation of subunits (separated areas of a layer), wherein a subunit may constitute an individual electronic device.

In an embodiment, the methods of the invention comprise providing insulating and/or separating lines for separating individual cells or groups of cells after the deposition of two or more (up to n) superposed and/or overlapping films as set out above. In is noted that the surface (or area) of the films may be larger than the surface of individual cells. For example, films may be deposited on surfaces covering ≥5 individual solar cells, preferably ≥10 solar cells, more than 100 solar cells. Insulating or separating lines may be produced by scribing, for example using a laser, which is preferably controlled to remove matter from the deposited films at predetermined positions, generally along lines defining cells to be separated or parts of such cells to be separated. In an embodiment, said separating lines electrically separate continuous surfaces of a layer, individual cells, groups of cells, or different layers of a cell. The separating lines may be drawn so as to provide or modify a connection in series and/or in parallel of individual cells or groups of cells.

The method of the invention, which provides depositing superposed and/or overlapping films having different compositions without conducting separate firing of each film after deposition, is advantageous as it enables the scribing of a plurality of films at the same time. In the context of the present specification, the scribing of a plurality of superposed or overlapping films may be referred to as "co-scribing". Preferably, said co-scribing applies to a plurality of yet unfired layers.

In an embodiment, the method is directed to producing an electronic device, for example a solar cell. In an embodiment, the method comprises depositing a sensitizing or light absorbing layer. Preferably, the sensitizer may comprise one or more organic components, which organic components need to be present in the functional device. For example, the sensitizer layer may be an organic-inorganic perovskite layer. In other embodiments, the sensitizer is a dye, for example an organic or metal-organic dye.

If the sensitizer layer comprises a heat-sensitive and/or organic component required for functional operation of the sensitizer layer, the sensitizer layer is preferably deposited after said co-firing. In this case, the sensitizer layer is preferably also deposited after co-scribing, since co-scribing is preferably conducted before co-firing.

In an embodiment, the method comprises depositing, after co-firing, one or more composition comprising the constituents of a light absorbing layer, or the precursors of such constituents, wherein said light absorbing layer is preferably an organic-inorganic perovskite layer. Deposition techniques for depositing such perovskite layers are known. In an embodiment, the perovskite layer is deposited by slot-die printing, inkjet and/or screen printing.

In an embodiment, one or more of said films, with the exception of the perovskite layer, are deposited by slot-die coating. Preferably, all said n films with the exception of the perovskite layer, are deposited by slot-die coating.

In another embodiment, one or more of said films, including the perovskite layer, are deposited by slot-die coating. Preferably, all said n films, including the perovskite layer, are deposited by slot-die coating.

In an embodiment, a composition to be deposited to provide a film by slot-die coating comprises two or more solvents. Preferably the respective composition comprises a low boiling point solvent and a high boiling point solvent. Preferably, said first, second, third, fourth, and up to $n^{th}$ composition comprises a high boiling point solvent and low boiling point solvent.

In an embodiment, the low boiling point solvent is selected from non-terpene alcohols, for example from the group consisting of methanol, ethanol, and isopropanol.

In an embodiment, the high boiling point solvent is selected from aprotic solvent and terpenes, for example from aromatic solvents and terpenes, including terpene alcohols. For example, the high boiling point solvent is selected from the group consisting of terpineol and tetralin.

The solvent components and other components and additives of each composition to be deposited, such as the binders, in addition to inorganic constituents and precursors thereof, are preferably adapted to the deposition technique chosen. Generally, for slot-die coating, more diluted and/or other compositions are used than for screen-printing, for example.

The following examples are provided to illustrate various embodiments of the present invention. The examples are not intended to limit the invention in any way.

EXAMPLES

Example 1: Preparation of Inks for Slot-Die Coating a Perovskite Solar Cell 1.1 Ink 1 for slot-die coating of a compact $TiO_2$ layer ($cTiO_2$)

Organic titanate (titanium diisopropoxide bis(acetylacetonate), was obtained from Sigma Aldrich (Merck).

1 vol % of the organic titanate was mixed with the following constituents at the indicated volume percentages:

10 vol. of tetralin (boiling point 208° C.),
7 vol. of isopropanol (boiling point 82° C.),
3 vol. of absolute ethanol (boiling point 78.24° C.),
0.002 vol. of Zonyl FS-300 fluorosurfactant (40 wt % in $H_2O$, as supplied).

The resulting mixture can be seen as a 1:20 volume dilution of the organic titanate in the mixture of the remaining solvents and surfactant.

1.2 Ink 2 for slot-die coating a mesoporous $TiO_2$ layer 1 vol. of the commercial titania paste (Ti-Nanoxide T/SP) obtained from Solaronix SA, rue de l'Ouriette 129, 1170 Aubonne, Switzerland (www.solaronix.com) was mixed with the following constituents:

10 vol. of isopropanol,
2 vol. of terpineol (boiling point 214-217° C.).

1.3 Ink 3 for slot-die coating a mesoporous zirconia ($mZrO_2$) layer 4 vol. of the zirconia paste Zr-Nanoxide ZT/SP obtained from Solaronix SA, was mixed with the following constituents:

1 vol. of terpineol,
9 vol. of isopropanol,
2 vol. of ethanol.

1.4 Ink 4 for slot-die coating a porous carbon layer 10 vol. of the original carbon non-diluted carbon paste Elcocarb B/SP was obtained from Solaronix and mixed with the following constituents as indicated:

2 vol. of isopropanol,
8 vol. of ethanol.

1.5 Ink 5 for slot-die coating a mesoporous NiOx layer 2 vol. of NiOx (in NiOx, the O is not stochiometric, generally between 0.5-2, or between 1-2) Screen Printed paste (Ni-Nanoxide N/SP) was obtained from Solaronix and mixed with the following constituents as indicated:

2 vol. of terpineol
5 vol. o-m-Xylene
5 vol. of ethanol.

The inks prepared as described were stored at room temperature (25° C.) until further use with magnetic steering.

Figure 2:
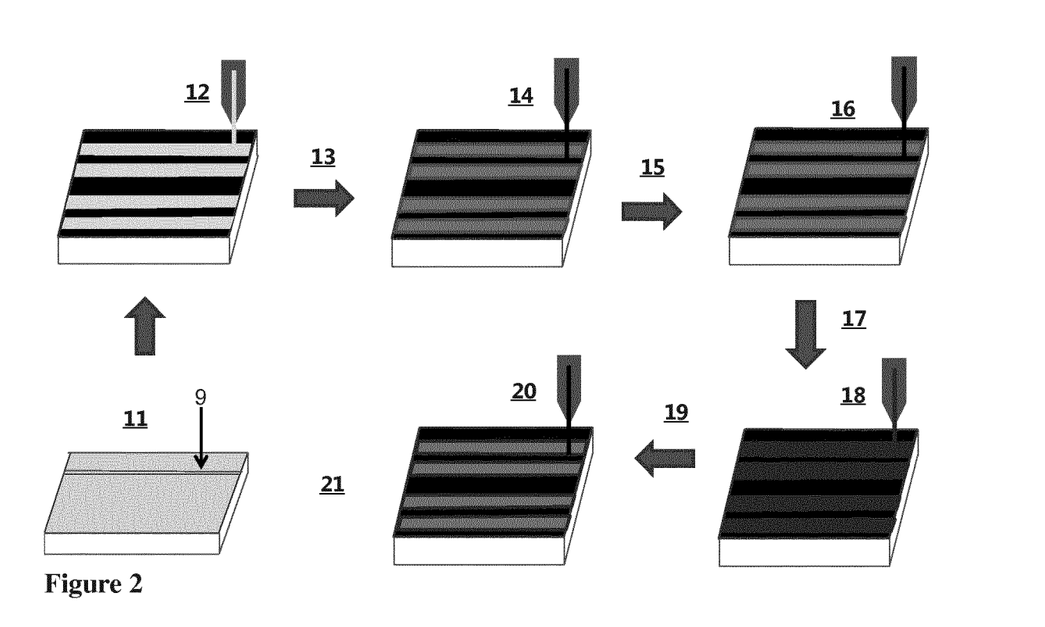
FIG. 2 schematically illustrates a sequence of process steps for producing solar cells in accordance with an embodiment of the invention.

Example 2: Deposition of Films by Slot-Die Coating and Firing to Obtained Layers The overall sequence of the deposition of films is indicated in FIG. 2. For the slot-die coating, a slot-die printer was obtained from TSE Troller AG, Murgenthal, Switzerland.

Figure 3:
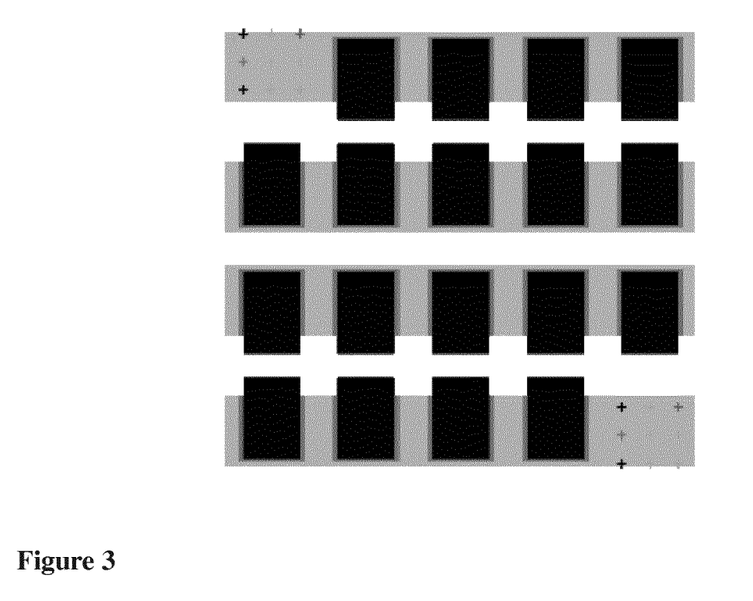
FIG. 3 is a schematic representation of the pattern of solar cells deposited on a 10 cm×10 cm FTO glass substrate in accordance with an embodiment of the invention.

First, an FTO glass substrate (10 cm×10 cm) was subjected to laser ablation so at to create insulating lines for electrically separating 4 stripes and preparing the deposition of overall 18 solar cells according to the pattern shown in FIG. 3.

The laser-scribed FTO substrates were cleaned by plasma cleaning.

2.1 Slot-die coating a film for a compact $TiO_2$ layer

At ref. 12 in FIG. 2, four (4) stripes of 14 mm width were deposited by slot-die coating ink 1 using the following parameters: speed of printer head: 1 m/min, flow rate: 0.2 ml/min, 50 micron internal shim foil.

The coating process was repeated so as two have two stripe-shaped films deposited one on top the other "wet on wet" (without intermediate drying). Thereafter, the films were dried at 70° C. for 10 min, followed by drying at 200° C. for 1 h (FIG. 2, ref. 13). These films will yield, in the final device (after firing) a compact $TiO_2$ layer of ≤40 nm thickness.

2.2 Slot-die coating a film for a mesoporous $TiO_2$ layer

At ref. 14 in FIG. 2, ink 2 was deposited with the slot-die printer in order to obtain a film using the following parameters: speed: 1 ml/min; flow rate of 0.8 ml/min; 14 mm stripe width; 50 micron internal shim foil.

The coating process was repeated so as two obtain two stripes deposited one on top the other "wet on wet" (without intermediate drying). Thereafter, the stripes were dried at 110° C. for 10 minutes (FIG. 2, ref 15). These films will yield, in the final device, a mesoporous $TiO_2$ layer of about 600 nm thickness.

2.3 Slot-die coating a film for a mesoporous $ZrO_2$ layer

At ref. 16 in FIG. 2, ink 3 was deposited with the slot-die printer using the following parameters: speed: 0.9 m/min, flow rate: 1.25 ml/min, 14 mm stripe width, 100 micron internal shim foil.

The coating process was repeated so as two obtain two stripe-shaped films deposited one on top the other "wet on wet" (without intermediate drying). Thereafter, the stripes were dried at 110° C. for 10 minutes (FIG. 2, ref. 17). These films will form, after firing, a mesoporous $ZrO_2$ layer of about 1600 nm thickness.

2.3a Slot-die coating a mesoporous $NiO_x$ layer

In an optional process step, a hole transport and/or p-type semiconductor film (ink 5) was deposited onto the $mZrO_2$ layer with the slot-die printer using the following parameters: speed: 1.0 m/min, flow rate: 1.0 ml/min. The coating process was repeated so as two obtain two stripes deposited one on top the other "wet on wet" (without intermediate drying). Thereafter, the stripes were dried at 110° C. for 10 minutes. These layers will form, after firing, a mesoporous $NiO_x$ layer of about 600 nm thickness.

2.4 Slot-die coating a porous carbon layer

At ref. 18 in FIG. 2, ink 4 was deposited with the slot-die printer in order to obtain a porous carbon layer using the following parameters: speed: 0.2 m/min, flow rate: 0.2 ml/min, 15 mm stripe width, 100 micron internal shim foil. The coating process was repeated so as two obtain two stripes deposited one on top the other "wet on wet" (without intermediate drying). Thereafter, the stripes were dried at 110° C. for 10 minutes (not shown in FIG. 2). These films will form, after firing, a porous carbon layer of 10-12 micron thickness.

2.5 Single co-firing of metal oxide and carbon layer

At ref. 19 in FIG. 2, the films deposited as described in points 2.1-2.4, including devices comprising the optional $NiO_x$ film of point 2.3a, were then co-fired at 450° C. for 1 hour, in order to remove organic residues.

Example 3: Preparation of a Perovskite Solar Cell

Example 3.1 Perovskite Deposition by Manual Pipetting

At ref. 20 in FIG. 2, perovskite solar cells were finalized by infiltration of $MAPbI_3$ (methyl ammonium lead iodide ink) on top of the carbon layers using pipetting, and the substrates were subjected to annealing at 50° C. for 1 h in a hot oven.

Example 3.2 Perovskite Deposition by Slot-Die Coating

Perovskite ink solution was deposited by slot-die printing on to the fired precursor cells obtained after step 2.5 above.

The perovskite deposition was conducted as described in in K. Hwang et al Adv. Mater. 27(7), 2015, "Toward Large Scale Roll-to-Roll Production of Fully Printed Perovskite Solar Cells".

FIG. 1A shows the architecture of solar cells 1 produced in accordance with Examples 1-3, where 2 represents the transparent conductive substrate comprising glass 3 and an FTO 4. The compact $TiO_2$ layer 5 is deposited on the FTO, followed by mesoporous $TiO_2$ 6, mesoporous $ZrO_2$ 7 and carbon 8. The cells connected in series by interconnecting scribes 9 made in the FTO layer and scribed 10 made by laser-scribing before firing.

FIG. 3 shows a top-down view on 18 perovskite solar cells on the 10 cm×10 cm FTO glass substrate produced as described in Example 2. FIG. 1B is a device as shown in FIG. 1A, further comprising a metal oxide p-type semiconductor layer 22 on top of the $mZrO_2$ layer. Furthermore, an overall sealing 3' is shown, which may be a resin or plastic foil, for covering and protecting the device after fabrication.

Example 4: Photovoltaic Parameters

The cells produced according to Examples 1-2 and 3.1 were tested under AM 1.5 simulated sunlight, 1000 W/m2. Voltage-current scan was conducted as follows: 1 V to −0.3 V, 5 mV increments, 1.2 s between each increment.

Figure 4:
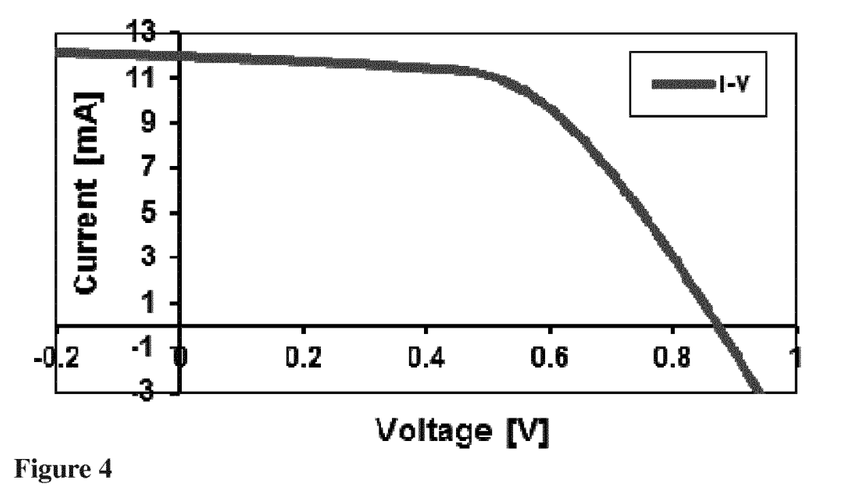
FIG. 4 is a graph showing the current-voltage (I-V) curve of an exemplary solar cell produced according to an embodiment of the invention.

The results are shown in FIG. 4. In average, perovskite solar cells exhibited a short circuit current ($J_{SC}$) of 18.75 mA/cm 2, an open current voltage ($V_{OC}$) of 0.89 V, a fill factor of 66.7 and a power conversion efficiency of 11.22% when measured at 1000 W/m² artificial sunlight. FIG. 4 shows the current-voltage (I-V) curve of a typical, fully slot-die coated perovskite solar cell.

Example 5: Further Characterization of Layer Structure

Besides device efficiency, we also consolidated layer formation, layer structure and interfacial properties by surface scanning and X-ray scattering techniques. The AFM images show the morphology obtained using different coating methods for each of the layers. The images were compared with images taken from layers deposited by spray pyrolysis. Generally, the layers obtained by slot-dye-coating exhibited reduced roughness but they follow the same roughness profile compared to the layers deposited by spray-pyrolysis.

The XRD spectra of the compact $TiO_2$ obtained by three different coating methods were prepared (slot-die coating, spray pyrolysis and screen printing). Also, the XRD of other slot die coated layers were compared with screen printed layers. The spectra of the various layers show the same main peaks, indicating comparable crystallinity.

Finally, perovskite formation in the complete MPSC (Monolithic Perovskite Solar Cell) stack was followed by XRD. The obtained results match the literature, thus confirming crystallization behaviour similar to the reported values and full conversion of precursor ink into perovskite. In particular, all the perovskite peaks are present.

Several publications and patent documents are cited in the foregoing specification in order to more fully describe the state of the art to which this invention pertains. The disclosure of each of these citations is incorporated by reference herein.

While certain of the preferred embodiments of the present invention have been described and specifically exemplified above, it is not intended that the invention be limited to such embodiments. Various modifications may be made thereto without departing from the scope and spirit of the present invention, as set forth in the following claims.

The invention claimed is:

1. A method for producing layers of an electronic device comprising said layers, the method comprising:
   depositing a first composition to provide a first film, wherein said first composition comprises the inorganic or carbon constituents of a first layer of said electronic device, or precursors of said inorganic constituents,
   depositing a second composition to provide a second film, wherein said second composition comprises the inorganic or carbon constituents of a second layer of said optoelectronic device, or precursors of said inorganic constituents,
   wherein said first and second compositions comprise, independently, at least one organic material,
   wherein said second film is at least partially deposited onto the first film so as to at least partially superpose and/or overlap with said first film, and,
   co-firing said two films by exposure to a temperature above 300° C., wherein, after depositing said first film, no firing above 300° C. is performed.

2. The method of claim 1, wherein said first and second compositions are different and comprise, independently, one or more selected from the group consisting of: an inorganic material, carbon, and an organic precursor of said inorganic material.

3. The method of claim 1, comprising:
   depositing a third composition to provide a third film, which is at least partially deposited onto the second film so as to at least partially superpose and/or overlap with said second film, said third composition comprising inorganic or carbon constituents of a third layer of said electronic device or precursors of said inorganic constituents;
   co-firing said first, second and third films by exposure to a temperature above 300° C., wherein, after depositing said first and second film, no firing above 300° C. is performed.

4. The method of claim 3, comprising:
   depositing a fourth composition to provide a fourth film, which at least partially superposes and/or overlaps with said third film, wherein said fourth composition comprises inorganic or carbon constituents of a third layer of said electronic device, or precursors of said inorganic constituents;
   co-firing said first, second, third films and fourth by exposure to a temperature above 300° C., wherein, after depositing said first, second and third film, no firing above 300° C. is performed.

5. The method of claim 1, wherein one or more of said first, second, third and fourth films, in as far as present, comprise at least one semiconductor material or a precursor thereof.

6. The method of claim 1, wherein one or more of said first, second, third and fourth films, in as far as present, comprises at least one metal oxide.

7. The method of claim 1, wherein one, two or more of said first, second, third and fourth films, in as far as present, comprises nanoparticles.

8. The method of claim 1,
   comprising drying said first, second, and, if applicable, third fourth and/or film after deposition and before deposition of a subsequent film, wherein drying is conducted at a temperature of ≤300° C.

9. The method of claim 1, wherein
   co-firing is conducted at a temperature of 350° C.

10. The method of claim 1, wherein co-firing is conducted at a temperature of 500° C.

11. The method of claim 1, wherein said first, second, third, and fourth compositions, as applicable, comprise one or more organics solvents and/or binders.

12. The method of claim 1, wherein said co-firing of said films yields the layers of said electronic device, wherein said layers lack organic material that was present in said compositions.

13. The method of claim 1, wherein said first composition comprises a first metal oxide and said second or third composition, if applicable comprises a second metal oxide, wherein said first metal oxide is a metal oxide from a different metal than said second metal oxide.

14. The method of claim 1, which comprises co-firing two or more different films comprising nanoparticles, and/or which comprises co-firing two or more different film yielding two or more mesoporous layers.

15. The method of claim 1, wherein said first composition comprises the constituents, or the precursors of such constituents, of a compact metal oxide semiconductor layer.

16. The method of claim 1, wherein said second composition comprises the constituents, or the precursors of such constituents, of a mesoporous metal oxide semiconductor layer.

17. The method of claim 3, wherein said third composition, comprises the constituents, or the precursors of such constituents, of a mesoporous metal oxide insulating layer.

18. The method of claim 4, wherein said fourth composition comprises the constituents, or the precursors of such constituents, of a porous carbon layer.

19. The method of claim 1, wherein each of said film has a thickness of 2 mm.

20. The method of claim 1, comprising, after depositing said first, and second films, and optionally after depositing said third, fourth and/or $n^{th}$ films, as applicable, and before co-firing said films, scribing said deposited films, in order to provide insulating lines and/or provide separate areas of said films.

21. The method of claim 1, comprising depositing, after co-firing, one or more composition comprising the constituents of light absorbing layer, or the precursors of such constituents, wherein said light absorbing layer is an organic-inorganic perovskite layer.

22. An optoelectronic device obtained by the method of claim 1, wherein said optoelectronic device is a solar cell selected from one or both of a perovskite solar cell and a solid state solar cell.

* * * * *